United States Patent [19]

Morita

[11] Patent Number: 4,696,056

[45] Date of Patent: Sep. 22, 1987

[54] FREQUENCY CONVERTING CIRCUIT

[75] Inventor: Hiroyuki Morita, Kumagaya, Japan

[73] Assignee: Kabushiki Kaisha Toshiba, Kawasaki, Japan

[21] Appl. No.: 751,235

[22] Filed: Jul. 2, 1985

[30] Foreign Application Priority Data

Jul. 5, 1984 [JP] Japan ............................. 59-137986

[51] Int. Cl.$^4$ ............................................. H04B 1/26
[52] U.S. Cl. .................................... 455/182; 455/209;
455/260; 455/265; 455/316; 375/83; 375/97;
375/120; 331/22
[58] Field of Search ............... 455/182, 183, 207–209,
455/192, 260, 265, 314–316; 331/22, 31, 1 A;
375/83, 84, 97, 119, 120

[56] References Cited

U.S. PATENT DOCUMENTS

| | | | |
|---|---|---|---|
| 4,303,893 | 12/1981 | Goldberg | 331/22 |
| 4,403,345 | 9/1983 | Granek et al. | 455/182 |
| 4,451,930 | 5/1984 | Chapman et al. | 455/316 |

OTHER PUBLICATIONS

IEEE Transactions on Communications, vol. COM-25, No. 10, 10/77, "Heterodyne Phase Locked Loops-Revisited", by Biswas et al.

*Primary Examiner*—Jin F. Ng
*Attorney, Agent, or Firm*—Cushman, Darby & Cushman

[57] ABSTRACT

A frequency converting circuit converts an input frequency into a desired frequency. To obtain the desired frequency, a first frequency converter converts the input frequency, by using an output frequency of a first local oscillator, into an intermediate frequency. The first local oscillator is a voltage controlled oscillator as a part of a phase locked loop circuit. A second frequency converter converts the intermediate frequency into the desired frequency by using an output frequency of a second local oscillator. A phase comparing circuit compares the phase of the output signal of the second frequency converter with that of the output signal of the first local oscillator. The phase comparing circuit is contained in the phase locked loop circuit. The result of the comparison is used for controlling the oscillating frequency of the first local oscillator.

19 Claims, 3 Drawing Figures

FREQUENCY CONVERTING CIRCUIT

BACKGROUND OF THE INVENTION

This invention relates to a frequency converting circuit, and more particularly to a frequency converting circuit with small frequency variation.

In the world today, there are strong demands for various quick, high quality information services. To meet such demands, industry has made remarkable advances in communication technology for information services for data, pictures, sound, etc. Typical implemented examples of these are; multichannel sound broadcasting, teletext, facsimile, still picture broadcasting, high quality TV, satellite broadcasting, etc., which are based on the digital technology. In these examples, the digital coding transmission is employed for the multichannel transmission. On the receiving side, for demodulation, the carrier wave signal is first reproduced based on the baseband signal, and subjected to an appropriate signal processing. In this communication system, the sound signal is modulated by a differential phase shift keying (DPSK) modulation system. The DPSK system is in the category of a phase shift keying (PSK) in which a phase of the carrier is varied according to the baseband signal. The PSK modulation is featured by good efficiency and carrier-to-noise (C/N) ratio. In the DPSK system, a phase of the carrier is used as a reference phase, and the phase of the carrier is shifted from the reference phase by predetermined phase angles. The DPSK system usually employed is a 4-phase or differential quaternary phase shift keying (DQPSK) system. In the DQPSK system, the phase of the carrier is stepwise varied in four phases 0°, 90°, 180°, and 270° with reference to the digitized sound signals. On the transmission side, the digitized sound signals are summed before being modulated, while on the receiving side, the received signals are subjected to subtraction for demodulation. The code system for the digitized signals is the so-called Gray code system. On the receiving side, a phase locked loop (PLL) circuit is used for the baseband signal selection.

In the DQPSK system, if noise is superposed on the transmitted DQPSK wave, a vector of the DQPSK wave varies to go out of a reference phase plane of the demodulation phase, and the demodulation axis of the adjacent phase is subjected to demodulation. Such an improper demodulation is also caused by a frequency variation occurring in the frequency converting circuit used for carrier reproduction. This provides a serious problem.

The frequency converting circuit performs the frequency conversion twice to obtain the sound DQPSK which is to be demodulated. The satellite television broadcasting system, for example, has one hundred and several tens channels, each channel having a 6 MHz frequency band. One of these channels is assigned to the exclusive use of the sound. The channel exclusively used by the sound is further divided into a plurality of frequency bands for transmitting the corresponding number of sound signals. To pick up a desired sound signal, the 6 MHz sound channel is first caught and then the desired sound signal is sought. It is for this reason that the two frequency conversions are conducted. This demodulation process will be given in more detail. An input signal of a frequency is applied to a first frequency converter as a mixer. In the first frequency converter, the input frequency is converted into an intermediate frequency, by using the oscillating frequency supplied from a voltage controlled oscillator (VCO) as a part of the PLL circuit. The output signal of the first frequency converter is applied to a second frequency converter. In the second frequency converter, the output frequency of the first frequency converter is converted into a desired frequency by using the oscillating frequency supplied from a local oscillator. This output signal of the second frequency converter is a baseband signal.

The PLL circuit contains a crystal oscillator providing a highly stable or fixed frequency signal. The output signal from the crystal oscillator is phase compared with the output signal from the VCO. The comparison result is used for controlling the VCO operation.

The circuit constants of the oscillator of the PLL circuit and the local oscillators are hardly fixed with time, inevitably resulting in a variation in the frequency and phase. The concomitant frequency and phase variation greatly influence the occurrence of bit error when the sound data is reproduced.

The baseband signal as obtained by frequency converting the input signal is synchronously detected by the DQPSK demodulator. The synchronous detection is a kind of phase detection in which a multiplying circuit multiplies the modulated signal by a reproduction carrier synchronized with the modulated signal, and the product signal is passed through a low pass filter, to obtain phase data of the baseband signal. To demodulate the digital sound signal as transmitted in the form of the DQPSK signal as a 4-phase DPSK signal, the 2-axis synchronous detection is used to detect the data to be Gray coded. To prevent bit error occurrence during this data detection, it is required to minimize a frequency variation when the input frequency is converted into the baseband frequency.

In the conventional frequency converting circuit, the input frequency of the DQPSK demodulation depends on the stability of the crystal oscillator of the PLL circuit and the local oscillators. Assuming that the frequency variation of the crystal oscillator is 50 ppm, and the output frequency of the first frequency converter is 300 MHz, then its frequency variation is large, 15 KHz in frequency. The accuracy of the data transmission is several hundreds of Hz. Therefore, the conventional frequency converting circuit inevitably involves demodulation error. Further, when the conventional frequency converting circuit is used for the carrier reproduction means of the DQPSK demodulation, the frequency pull-in range is narrow. For this reason, even if the frequency is pulled in in the critical region of the pull-in, when data is demodulated by the DQPSK, the demodulated output level is low, and data is likely to be demodulated in the phase not to be demodulated, leading to bit error occurrence.

Assuming that the amplitude of the synchronous detection output signal is $\pm V$, and it is superposed with Gaussian noise of variance $a^2$, a bit error rate $P_e$ is expressed, using a normal error integration function $\Phi(Z)$ $$P_e = 2[1 - \Phi(\sqrt{C/N})]$$

where C/N is a subcarrier power-to-noise ratio. If the pull-in range is narrow, the C/N is poor and hence the bit error rate is large.

This implies that when the pull-in range is narrow, the pull-in is performed, but the eye aperture is degraded, leading to occurrence of bit error.

SUMMARY OF THE INVENTION

Accordingly, the primary object of the present invention is to provide a frequency converting circuit with small frequency variation.

According to the present invention, there is provided a frequency converting circuit for converting an input frequency into a desired stable output frequency, said frequency converting circuit comprising a first oscillator for producing a first intermediate frequency, a second oscillator for producing a second intermediate frequency, a first frequency converter for converting said input frequency into a third intermediate frequency by using said first intermediate frequency supplied from said first oscillator, a second frequency converter for converting said third intermediate frequency into said desired frequency by using said second intermediate frequency supplied from said second oscillator, and a control means for controlling the frequency produced by said first oscillator according to the output frequency of said second frequency converter.

DETAILED DESCRIPTION OF THE PREFERRED EMBODIMENTS

Figure 1:
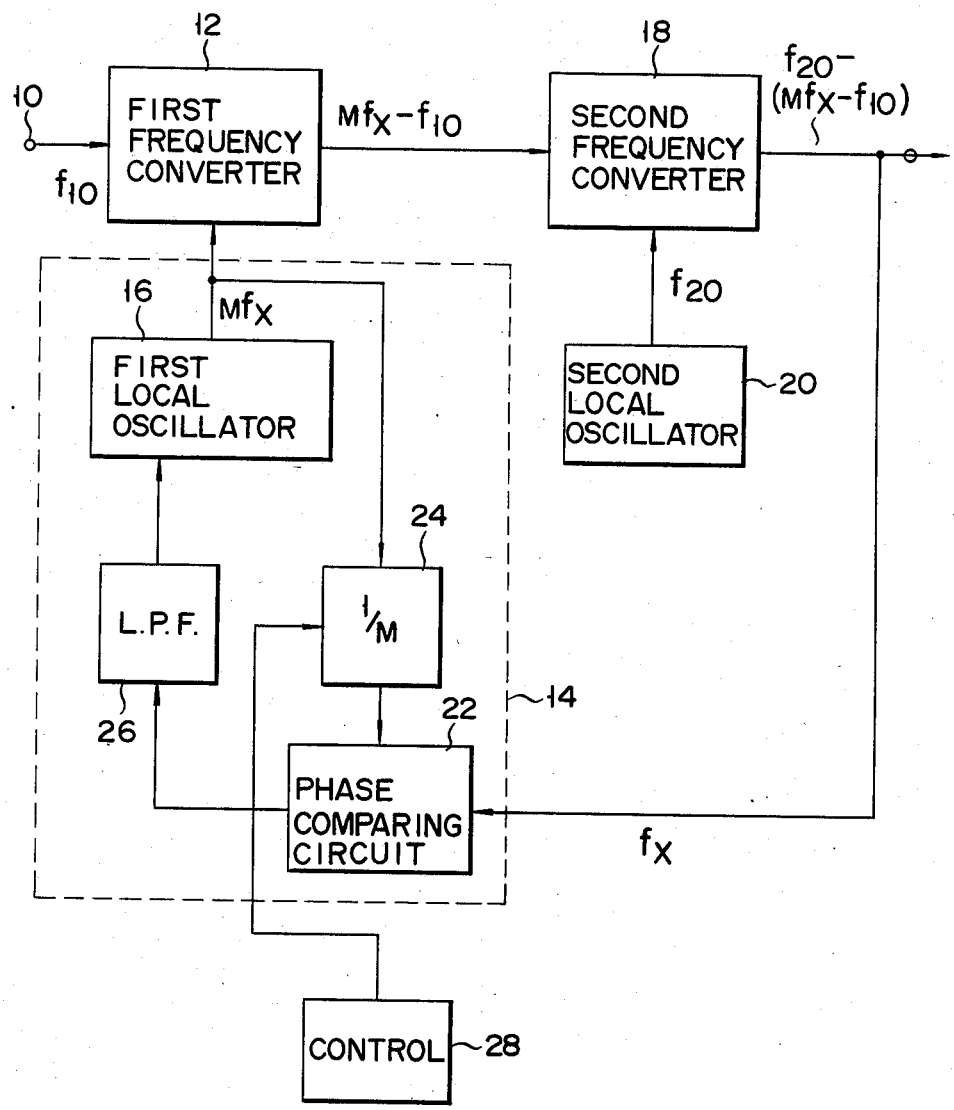
FIG. 1 is a block diagram of a frequency converting circuit according to an embodiment of the present invention, in which the signal to be transmitted is subjected to PSK modulation.

FIG. 1 is a block diagram of an embodiment of the present invention, in which the signal to be transmitted is subjected to PSK modulation. An input signal of frequency $f_{10}$ enters through an input terminal 10 to a first frequency converter 12. The first frequency converter 12 is also connected for reception to an output signal of a first local oscillator 16 in a phase locked loop (PLL) circuit 14. The frequency of the output signal of the first local oscillator 16 is $Mf_x$. Then, the frequency of the output signal of the first frequency converter 12 is $Mf_x-f_{10}$.

The $Mf_x-f_{10}$ signal is connected for transfer to one of the input terminals of a second frequency converter 18. The other input terminal of the second frequency converter 18 is connected to a signal of frequency $f_{20}$ generated by a second local oscillator 20. The second frequency converter 18, receiving the signals of $Mf_x-f_{10}$ and $f_{20}$, produces a signal of frequency $f_{20}-(Mf_x-f_{10})$. The output signal with such a frequency is applied to a DQPSK demodulator (not shown) at the succeeding stage, in the form of a signal that has been subjected to a desired frequency conversion, that is, a baseband signal.

The output frequency $f_x$ of the second frequency converter 18 is fed back to the PLL circuit 14.

The PLL circuit 14 is made up of the first local oscillator 16, a phase comparing circuit 22, a programmable divider 24, and a low pass filter 26. The output frequency $f_x$ of the second frequency converter 18 is supplied to one of the input terminals of the phase comparing circuit 22 in the PLL circuit 14. The programmable divider 24 supplies a frequency to the other input terminal of the phase comparing circuit 22. A control unit 28 provides the programmable divider 24 with an adequate frequency division factor M so that the frequency supplied to the phase comparing circuit 22 becomes $f_x$. In other words, when the frequency division factor supplied to the programmable divider 24 is set at M by the control unit 28, the programmable divider 24 divides the output frequency $Mf_x$ supplied from the first local oscillator 16 by using the factor M so as to produce a signal having the frequency $f_x$. The output signal of $f_x$ from the programmable divider 24 and the baseband signal from the second frequency converter 18 are phase compared in the phase comparing circuit 22. The resultant signal from the phase comparing circuit 22 is supplied to the low pass filter 26 where it is smoothed. The smoothed voltage signal is then applied to the first local oscillator 16. The first local oscillator 16 as a voltage controlled oscillator (VCO) is controlled by the smoothed voltage so that the oscillating frequency is $Mf_x$.

As recalled, the frequency of the baseband signal produced by the frequency converting circuit thus arranged is mathematically expressed $$f_x = f_{20} - (Mf_x - f_{10}) \tag{1}$$

Rearranging the equation (1), we have $$f_x = (f_{10} + f_{20})/(1+M) \tag{2}$$

As seen from the equation (2), the frequency converting circuit of the present embodiment reduces the variation of the converted frequency to $1/(1+M)$ (M is 15 or more). Assuming that the oscillating frequency of the second local oscillator 20 is 63.15 MHz and a frequency regulation of the oscillator per se is 25 ppm, a frequency variation is approximately 1.6 KHz. If M=15 in the equation (2), the frequency regulation is reduced to approximately 100 Hz.

This fact implies that the frequency variation is small and the frequency pull-in range is also widened. Therefore, if the baseband signal obtained by the frequency converting circuit shown in FIG. 1 is used for the DQPSK demodulator, the frequency of the carrier will be stable. Thus, a bit error rate will be extremely small.

While the output frequency of the first local oscillator 16 is $Mf_x$ in the above embodiment, that frequency may be $f_x$ and directly applied to the input terminal of the phase comparing circuit 22. In this case, a frequency multiplying circuit for multiplying the frequency M times must be inserted between the first local oscillator 16 and the first frequency converter 12. This alternative arrangement can provide the baseband signal with a frequency as given by the equation (1). The frequency converting scheme which allows the equation (1) to hold, may be implemented by other circuit arrangements than the FIG. 1 arrangement.

Figure 2:
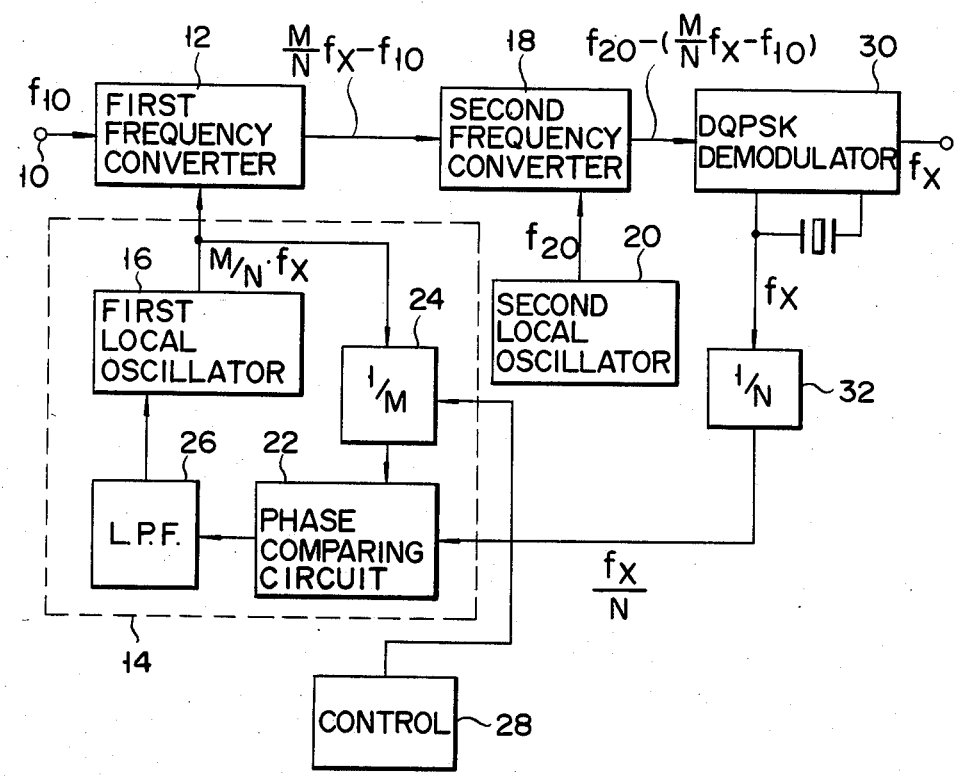
FIG. 2 is a block diagram of a frequency converting circuit according to another embodiment of the present invention.

FIG. 2 is a block diagram of another embodiment of the present invention. In the figure, like portions are designated by the same numerals in FIG. 1. The major difference of the circuit arrangement of FIG. 2 from that of FIG. 1 resides in that the output signal of the DQPSK demodulator, not the second frequency converter 18, is fed back to the PLL circuit 14.

An input signal of frequency $f_{10}$ enters through an input terminal 10 to one of the input terminals of a first frequency converter 12. The first frequency converter 12 is also connected for reception to an output signal of a first local oscillator 16 in a phase locked loop (PLL) circuit 14. The frequency of the output signal of the first local oscillator 16 is $(M/N)f_x$. Then, the frequency of the output signal of the first frequency converter 12 is $(M/N)f_x - f_{10}$.

The $(M/N)f_x - f_{10}$ signal is connected for transfer to one of the input terminals of a second frequency converter 18. The other input terminal of the second frequency converter 18 is connected to a signal of frequency $f_{20}$ generated by a second local oscillator 20. The second frequency converter 18, receiving the signals of $(M/N)f_x - f_{10}$ and $f_{20}$, produces a signal of frequency $f_{20} - ((M/N)f_x - f_{10})$. The output signal, with such a frequency, is applied, as a baseband signal, to a DQPSK demodulator 30 at the succeeding stage.

The output signal of frequency $f_x$ from the DQPSK demodulator 30 is frequency divided into a factor of N by a frequency divider 32. The output signal of $f_x/N$ is input, as a feedback signal, to one of the input terminals of the phase comparing circuit 22 in the PLL circuit 14.

The PLL circuit 14 is made up of the first local oscillator 16, a programmable divider 24, the phase comparing circuit 22, and a low pass filter 26. The programmable divider 24 is controlled by a control unit 28 to have a frequency division factor M. The factor M provides a frequency $f_x/N$ of the output signal from the programmable divider 24, which in turn is applied to the other input terminal of the phase comparing circuit 22. The frequency division factor M, when set by the control unit 28, depends on a receiving channel. The output signal of $f_x/N$ from the programmable divider 24 and the signal from the frequency divider 32 are phase compared in the phase comparing circuit 22. The resultant signal from the phase comparing circuit 22 is supplied to the low pass filter 26 where it is smoothed. The smoothed voltage signal is then applied to the first local oscillator 16. The first local oscillator 16 as a voltage controlled oscillator (VCO) is controlled by the smoothed voltage so that the oscillating frequency is $(M/N)f_x$.

As the result of such control, the signal of frequency $(M/N)f_x$ is input to the other input terminal of the first frequency converter 12. Accordingly, the output signal of the first frequency converter 12 has frequency $(M/N)f_x - f_{10}$. The output signal with such frequency is applied to the second frequency converter 18. The second frequency converter 18 frequency converts its input signal by the signal from the second local oscillator 20, thereby to have converted frequency $f_{20} - \{(M/N) f_x - f_{10}\}$. This frequency of the signal output from the second frequency converter 18 is made equal to the desired frequency $f_x$ through a frequency feedback process in which the output frequency of the DQPSK demodulator 30 is supplied to the PLL circuit 14. Then, we have $$f_x = f_{20} - \{(M/N)f_x - f_{10}\} \quad (3)$$

Rearranging the equation (3), we can write $$f_x = \frac{1}{1 + \frac{M}{N}}(f_{10} + f_{20}) = (N/(N + M))(f_{10} + f_{20}) \quad (4)$$

If $M >> N$, a frequency variation of the output signal of the DQPSK demodulator 30 is reduced.

If the frequency converting circuit according to the present invention is applied for reproducing the carrier signal to demodulate the DQPSK wave signal, the baseband signal is stable, degradation of an eye aperture is lessened, and bit error occurrence can be reduced.

In the above-mentioned embodiment, the signal of frequency $f_x/N$ from the programmable divider 24 is phase compared with the signal of $f_x/N$ from the frequency divider 32. Alternatively, The frequency $f_x/N$ of the signal from the frequency divider 32 is multiplied by M to form a frequency $(M/N)f_x$. This signal of $(M/N)f_x$ is directly phase compared with the output signal of $(M/N)f_x$ from the first local oscillator 16.

Figure 3:
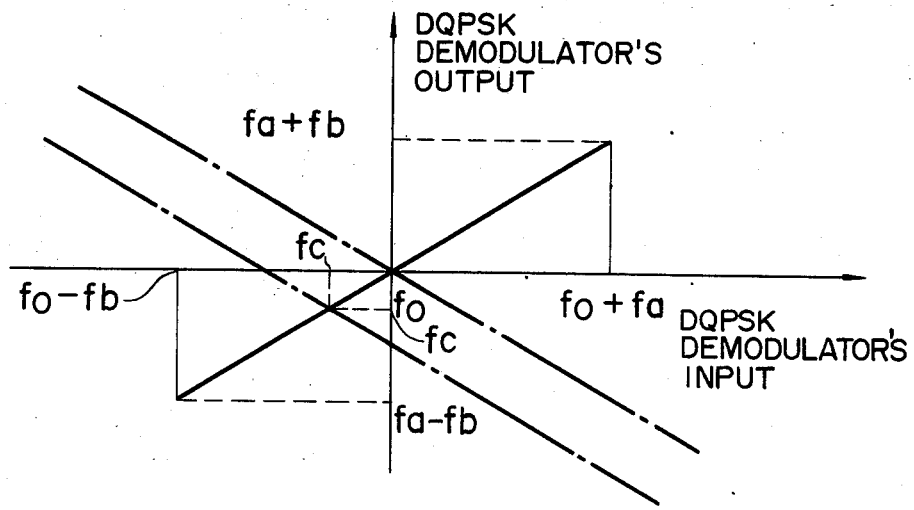
FIG. 3 shows a graph illustrating a frequency characteristic of a DQPSK demodulator used in the circuit of FIG. 2.

Turning now to FIG. 3, there is illustrated a relationship of input frequency vs. output frequency of the DQPSK demodulator 30 in FIG. 2. In the graph, $f_0$ indicates the center frequency in the DQPSK demodulator 30, $f_0 + f_a$ indicates the upper limit frequency, $f_0 - f_b$ is the lower limit frequency and one dot chain lines indicate a detecting characteristic of the DQPSK demodulator 30. Assume now that the input frequency of the DQPSK demodulator 30 varies and the center frequency $f_0$ is shifted to $f_c$, the frequency of the reproduced carrier wave signal in the DQPSK demodulator 30 is also $f_c$.

Thus, the inclination of the detecting characteristic indicated by the one dot chain line shown in FIG. 3 will be gentle due to a feedback effect. As a result, the variation of the demodulation output frequency, which is caused by the variation of the input frequency of the DQPSK demodulator 30, will be reduced.

As seen from the graph, if the frequency variation is confined within the range between the upper and the lower limit frequencies $(f_0 + f_a)$ and $(f_0 - f_b)$, the bit error occurring in the DQPSK demodulator 30 is reduced. In the frequency converting circuit according to the present invention, the frequency variation can be limited to a desired level by appropriately setting the frequency division factor. This implies that the effective pull-in range of the frequency converting circuit is widened, and that the carrier wave signal is reproduced by the frequency converted signal, the bit error occurrence can be reduced.

What is claimed is:

1. A frequency converting circuit for converting an input frequency into a stable output frequency, said frequency converting circuit comprising:

a first frequency converter for converting said input frequency into a first intermediate frequency;

first oscillator means for supplying a first oscillating frequency to said first frequency converter, said first oscillator means including a voltage controlled oscillator providing said first oscillating frequency;

a second frequency converter for converting said first intermediate frequency into a second intermediate frequency comprising; and control means coupled between said first oscillator means and said second frequency converter, for controlling said first oscillating frequency of said first oscillator means according to said second intermediate frequency supplied from said second frequency converter, said control means including a phase locked loop circuit coupled to said voltage controlled oscillator, said phase locked loop circuit further including programmable divider for dividing said first oscillating frequency of said voltage controlled oscillator by factor M, and a phase comparing circuit for comparing the phase of an output signal of said programmable divider with the phase of an output signal of said second frequency converter, the result of the comparison controlling said first oscillating frequency of said voltage controlled oscillator.

2. A frequency converting circuit according to claim 1, wherein said first oscillating frequency of said voltage controlled oscillator is M times said second intermediate frequency.

3. A frequency converting circuit for converting an input frequency into a stable output frequency, said frequency converting circuit comprising:
   a first frequency converter for converting said input frequency into a first intermediate frequency;
   first oscillator means for supplying a first oscillating frequency to said first frequency converter, said first oscillator means means including a voltage controlled oscillator providing said first oscillator frequency;
   a second frequency converter for converting said first intermediate frequency into a second intermediate frequency comprising;
   demodulator means for demodulating the output signal of said second frequency converter; and
   control means coupled between said first oscillator means and said demodulator means, and for controlling said first oscillating frequency of said first oscillator means according to the output frequency of said demodulator means, said control means including a phase locked loop circuit coupled to said voltage controlled oscillator, said phase locked loop circuit further including a programmable divider for dividing said first oscillating frequency of said voltage controlled oscillator by factor M, and a phase comparing circuit for comparing the phase of an output signal of said programmable divider with the phase of an output signal of said demoldulator means, the frequency of which is divided by factor N, the result of the comparison controlling said first oscillating frequency of said voltage controlled oscillator.

4. A frequency converting circuit according to claim 3, wherein said first oscillating frequency of said voltage controlled oscillator is M/N times output $f_x$ of said demodulator means.

5. A frequency converting circuit for converting an input frequency into a stable output frequency, comprising:
   a first frequency converter for converting said input frequency into a predetermined frequency;
   a phase locked loop (PLL) circuit including first oscillating means for supplying a first local oscillating frequency to said first frequency converter, said first oscillator means including a voltage controlled oscillator (VCO);
   a second frequency converter having an output, for converting said predetermined frequency into said output frequency;
   second oscillating means for supplying a second local oscillating frequency to said second frequency converter; and
   means for feeding back frequency information of said output frequency to said PLL circuit,
   said PLL circuit controlling the oscillating frequency of said first oscillator means in accordance with frequency data which is fed back from the output of said second converter, and said PLL circuit further including a programmable divider for dividing said first local oscillator frequency of said VCO by factor M, and a phase comparing circuit for comparing the phase of an output signal of said programmable divider with the phase of an output signal of said second frequency converter, the result of the comparison controlling said first local oscillating frequency of said VCO, thereby reducing a variation in said output frequency due to a variation in said input frequency to $1/(1+M)$.

6. A frequency converting circuit according to claim 5, wherein said factor M is approximately 15 or more.

7. A frequency converting circuit according to claim 6, wherein said PLL circuit controls the oscillating frequency of said VCO in accordance with frequency data which is fed back from the output of said second converter, thereby reducing a variation in said output frequency due to a variation in said second local oscillating frequency to $1/(1+M)$.

8. A frequency converting circuit according to claim 5, wherein said frequency converting circuit further comprises carrier reproduction means for reproducing an output signal of said second frequency converter, and wherein said PLL circuit controls the oscillating frequency of said first oscillator means in accordance with frequency data of carriers reproduced by said carrier reproduction means, thereby reducing a variation in said output frequency due to a variation in said input frequency.

9. A frequency converting circuit according to claim 8, wherein said first oscillator means comprises a voltage controlled oscillator (VCO), and wherein said PLL circuit further includes a programmable divider for dividing said first local oscillating frequency of said VCO by factor M, and a phase comparing circuit for comparing the phase of an output signal of said programmable divider with the phase of an output signal of said carrier reproduction means, the result of the comparison controlling said first local oscillating frequency of said VCO, thereby reducing a variation in said outout frequency due to a variation in said input frequency to $1/(1+M)$.

10. A frequency converting circuit according to claim 9, wherein said factor M is approximately 15 or more.

11. A frequency converting circuit according to claim 10, wherein said PLL circuit controls the oscillating frequency of said VCO in accordance with frequency data which is fed back from the output of said second converter, thereby reducing a variation in said output frequency due to a variation in said second local oscillating frequency to $1/(1+M)$.

12. A frequency converting circuit according to claim 11, wherein said carrier reproduction means comprises a demodulator.

13. A frequency converting circuit according to claim 12, wherein said demodulator includes a demodulator for phase shift keying.

14. A frequency converting circuit according to claim 8, wherein said frequency data of carriers obtained by said carrier reproduction means is supplied to said PLL circuit through a divider for dividing said frequency data of carriers by factor N.

15. A frequency converting circuit according to claim 14, wherein said first oscillator means comprises a voltage controlled (VCO), and wherein said PLL circuit further includes a programmable divider for dividing said first local oscillating frequency of said VCO by factor M, and a phase comparing circuit for comparing the phase of an output signal of said programmable divider with the phase of an output signal of said divider, the result of the comparison controlling said first local oscillating frequency of said VCO, thereby reducing a variation in said output frequency due to a variation in said input frequency to $N/(N+M)$.

16. A frequency converting circuit according to claim 15, wherein M is larger than N.

17. A frequency converting circuit according to claim 16, wherein said PLL circuit controls the oscillating frequency of said VCO in accordance with frequency information which is fed back from an output of said divider, thereby reducing a variation in said output frequency due to a variation in said second local oscillating frequency to $N/(N+M)$.

18. A frequency converting circuit according to claim 17, wherein said carrier reproduction means comprises a demodulator.

19. A frequency converting circuit according to claim 18, wherein said demodulator includes a demodulator for phase shift keying.

* * * * *